(12) United States Patent
Singh et al.

(10) Patent No.: US 11,644,493 B2
(45) Date of Patent: May 9, 2023

(54) SYSTEMS AND METHODS FOR ESTIMATION OF SENSOR RESISTANCE

(71) Applicant: Cirrus Logic International Semiconductor Ltd., Edinburgh (GB)

(72) Inventors: Saurabh Singh, Cedar Park, TX (US); Chandra B. Prakash, Austin, TX (US); Eric Kimball, Austin, TX (US); Cory J. Peterson, Austin, TX (US); Ryan Lobo, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/668,445

(22) Filed: Feb. 10, 2022

(65) Prior Publication Data

US 2023/0003779 A1    Jan. 5, 2023

Related U.S. Application Data

(60) Provisional application No. 63/216,873, filed on Jun. 30, 2021.

(51) Int. Cl.
  *G01R 27/08*  (2006.01)
  *G01R 27/02*  (2006.01)
  (Continued)

(52) U.S. Cl.
  CPC ............ *G01R 27/08* (2013.01); *G01R 17/105* (2013.01); *G01R 27/02* (2013.01); *G01R 19/0084* (2013.01); *G01R 19/0092* (2013.01)

(58) Field of Classification Search
  CPC ........ G01R 27/00; G01R 27/02; G01R 27/08; G01R 19/00; G01R 19/0084;
  (Continued)

(56) References Cited

U.S. PATENT DOCUMENTS

| 4,068,166 A | * | 1/1978 | Pichon | ................. | G01R 17/105 |
| | | | | | 324/706 |
| 4,080,829 A | * | 3/1978 | Pichon | ................... | G01R 27/14 |
| | | | | | 374/114 |

(Continued)

FOREIGN PATENT DOCUMENTS

| CN | 203396875 U | * | 1/2014 | ............. | G01R 31/02 |
| CN | 105115532 A | * | 12/2015 | ............. | G01D 18/00 |

(Continued)

OTHER PUBLICATIONS

Combined Search and Examination Report under Sections 17 and 18(3), UKIPO, Application No. GB2204056.2, dated Sep. 26, 2022.

*Primary Examiner* — Hoai-An D. Nguyen
(74) *Attorney, Agent, or Firm* — Jackson Walker L.L.P.

(57) ABSTRACT

A method for estimating resistances of a circuit having a plurality of resistances comprising a first resistance and a second resistance may include applying a first bias voltage across the circuit and measuring a first voltage at a common node between the first resistance and the second resistance in order to determine a mathematical relationship between the first resistance and the second resistance, applying a second bias voltage across the circuit and a third resistance in parallel with the circuit and measuring a second voltage at the common node between the first resistance and the second resistance in order to determine a mathematical relationship between the third resistance and at least one of the first resistance and the second resistance, and based on at least the measurement of the first voltage and the measurement of the second voltage, determining the first resistance and the second resistance as a function of the third resistance.

28 Claims, 5 Drawing Sheets

(51) Int. Cl.
*G01R 17/10* (2006.01)
*G01R 19/00* (2006.01)

(58) Field of Classification Search
CPC .... G01R 19/0092; G01R 17/00; G01R 17/10; G01R 17/105
USPC ................................ 324/600, 649, 691, 713
See application file for complete search history.

(56) References Cited

U.S. PATENT DOCUMENTS 10,310,050 B2    6/2019  Park et al.
2019/0383684 A1* 12/2019 Kollias ..................... G01L 9/12

FOREIGN PATENT DOCUMENTS

JP          H0375570 A      3/1991
JP           3120970 B2 *  12/2000   ............. G01R 27/08
WO         2007063955 A1    6/2007

* cited by examiner

SYSTEMS AND METHODS FOR ESTIMATION OF SENSOR RESISTANCE

RELATED APPLICATION

The present disclosure claims priority to U.S. Provisional Patent Application Ser. No. 63/216,873, filed Jun. 30, 2021, which is incorporated by reference herein in its entirety.

FIELD OF DISCLOSURE

The present disclosure relates in general to in-system detection of resistances of an electronic sensor, such as resistances making up a strain gauge bridge sensor.

BACKGROUND

A wide variety of applications utilize electronic sensors to measure physical quantities. For example, a strain gauge for detecting pressure or force is often implemented in what is known as a Wheatstone bridge. A Wheatstone bridge is an electrical circuit used to measure an unknown electrical resistance by balancing two legs of a bridge circuit, one leg of which includes the unknown component. The primary benefit of the Wheatstone bridge circuit is its ability to provide extremely accurate measurements, in contrast with something like a simple voltage divider. The unknown electrical resistance may be a variable resistance having a resistance that varies as a function of a force or pressure.

It may be desirable in certain instances to measure individual resistances of a Wheatstone bridge or other resistance-based sensors after deployment (e.g., in-situ, once delivered to an intended end user). However, existing approaches for measuring such individual resistances may not provide desired levels of accuracy for such measurements.

SUMMARY

In accordance with the teachings of the present disclosure, the disadvantages and problems associated with estimating resistances associated with an electronic sensor may be reduced or eliminated.

In accordance with embodiments of the present disclosure, a method for estimating resistances of a circuit having a plurality of resistances comprising a first resistance and a second resistance may include applying a first bias voltage across the circuit and measuring a first voltage at a common node between the first resistance and the second resistance in order to determine a mathematical relationship between the first resistance and the second resistance, applying a second bias voltage across the circuit and a third resistance in parallel with the circuit and measuring a second voltage at the common node between the first resistance and the second resistance in order to determine a mathematical relationship between the third resistance and at least one of the first resistance and the second resistance, and based on at least the measurement of the first voltage and the measurement of the second voltage, determining the first resistance and the second resistance as a function of the third resistance.

In accordance with embodiments of the present disclosure, a system for estimating resistances of a circuit having a plurality of resistances comprising a first resistance and a second resistance may include a controller configured to apply a first bias voltage across the circuit and measuring a first voltage at a common node between the first resistance and the second resistance in order to determine a mathematical relationship between the first resistance and the second resistance, apply a second bias voltage across the circuit and a third resistance in parallel with the circuit and measuring a second voltage at the common node between the first resistance and the second resistance in order to determine a mathematical relationship between the third resistance and at least one of the first resistance and the second resistance, and based on at least the measurement of the first voltage and the measurement of the second voltage, determine the first resistance and the second resistance as a function of the third resistance.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Figure 1:
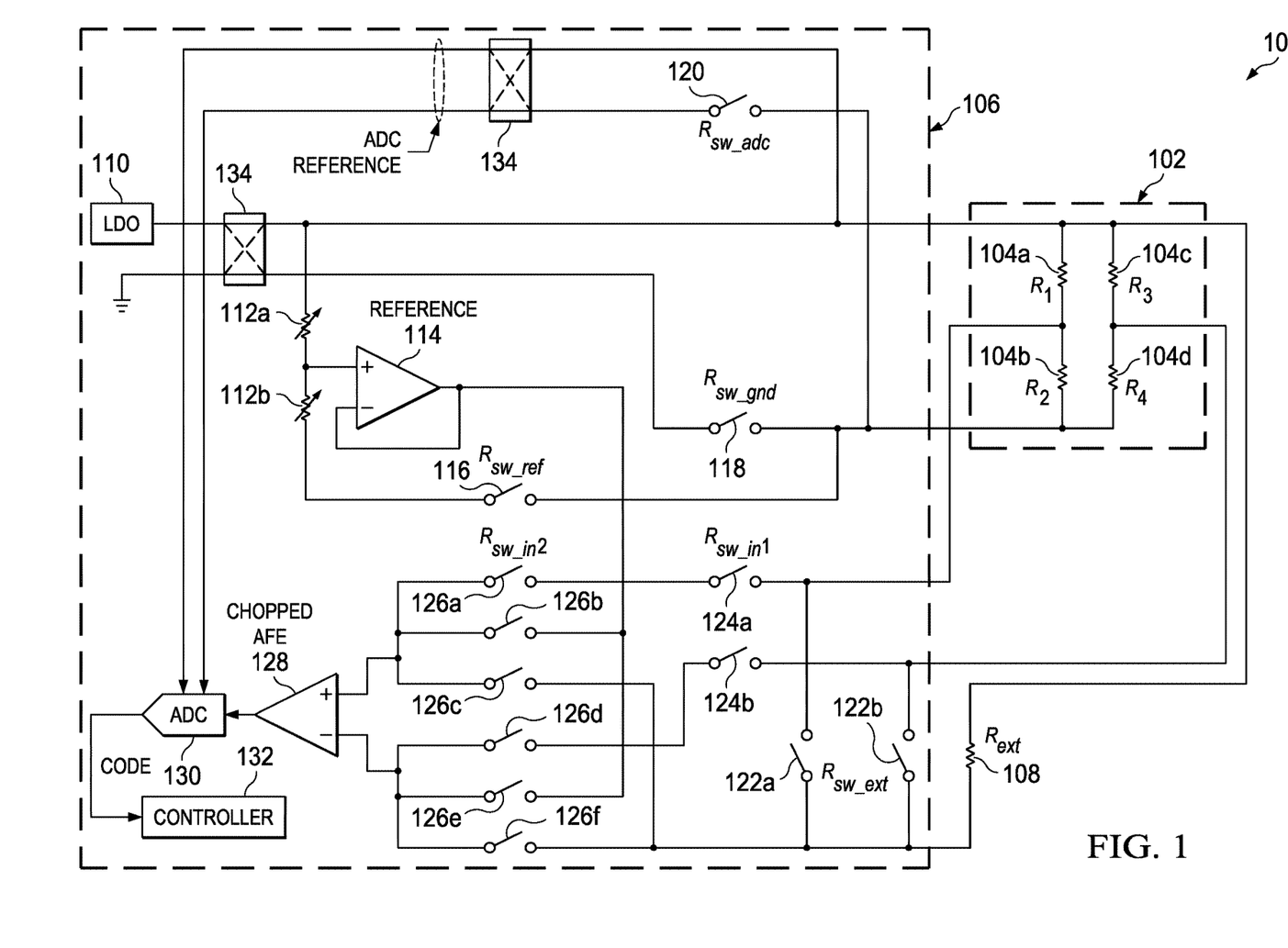
FIG. 1 illustrates a block and circuit diagram of an example system for estimating resistances of a Wheatstone bridge circuit, in accordance with embodiments of the present disclosure.

FIG. 1 illustrates a block and circuit diagram of an example system 100 for estimating resistances (e.g., resistances $R_1$, $R_2$, $R_3$, and $R_4$, respectively, of resistors 104a, 104b, 104c, and 104d) of a Wheatstone bridge circuit 102, in accordance with embodiments of the present disclosure. In addition to Wheatstone bridge circuit 102, system 100 may also include an integrated circuit 106 and an external resistor 108 having a resistance $R_{ext}$ arranged as shown.

As depicted in FIG. 1, integrated circuit 106 may include a low dropout regulator (LDO) 110, variable reference resistors 112a and 112b, a reference amplifier 114, a reference switch 116 (having a resistance $R_{sw\_ref}$ when closed), a ground switch 118 (having a resistance $R_{sw\_gnd}$ when closed), an analog-to-digital converter (ADC) switch 120 (having a resistance $R_{sw\_adc}$ when closed), resistor switches 122a and 122b (each having a resistance $R_{sw\_ext}$ when closed), primary input switches 124a and 124b (each having a resistance $R_{sw\_in1}$ when closed), secondary input switches 126a-f (each having a resistance $R_{sw\_in2}$ when closed), chopped analog front end (AFE) 128, ADC 130, controller 132, and choppers 134 arranged as shown in FIG. 1. Ground switch 118 and ADC switch 120 may be required when multiple sensors are present.

LDO 110 may comprise any suitable system, device, or apparatus configured to generate a reference voltage for use by components of system 100. In some embodiments, a voltage regulator other than an LDO may be employed.

Each variable reference resistor 112a and 112b may comprise a variable resistor having a variable resistance controlled by controller 132 (connectivity of control signals for providing such control are not shown, for purposes of clarity of exposition). In operation, as set forth in greater detail below, variable reference resistors 112a and 112b may create a voltage divider having a ratio used in performing estimations for resistances $R_1$, $R_2$, $R_3$, and $R_4$.

Reference amplifier 114 may comprise any suitable operational amplifier coupled at its positive terminal to a voltage node interfaced between variable reference resistors 112a and 112b, and its output coupled to its negative terminal, such that reference amplifier 114 generates at its output a voltage approximately equal to the voltage node interfaced between variable reference resistors 112a and 112b.

Each of reference switch 116, ground switch 118, analog-to-digital converter (ADC) switch 120, resistor switches 122a and 122b, primary input switches 124a and 124b, and secondary input switches 126a-f may include a transistor (e.g., n-type field effect transistor) or any other suitable system, device, or apparatus for implementing a switch that may selectively be toggled opened (e.g., off, disabled, deactivated) and closed (e.g., on, enabled, activated). The closing and opening of such switches may be controlled by controller 132 (connectivity of control signals for providing such control are not shown, for purposes of clarity of exposition).

Chopped AFE 128 may comprise any suitable system, device, or apparatus to condition a differential input signal received at its input for use by ADC 130. Accordingly, chopped AFE 128 may include analog signal conditioning circuitry comprising analog amplifiers, filters, application-specific integrated circuits for sensors, and/or other circuits to provide a configurable and flexible electronics functional block to interface between Wheatstone bridge 102, external resistor 108, and reference amplifier 114 on one hand and ADC 130 on the other hand.

ADC 130 may comprise any suitable system, device, or apparatus configured to convert an analog signal generated by chopped AFE 128 into an equivalent digital signal CODE.

Controller 132 may include any suitable system, device, or apparatus configured to receive values of digital signal CODE from ADC 130 and, as described in greater detail below, estimate resistances $R_1$, $R_2$, $R_3$, and $R_4$. In addition, controller 132 may, as described in greater detail below, control operation of variable reference resistors 112a and 112b and the various switches of integrated circuit 106 in order to generate values of digital signal CODE from which resistances $R_1$, $R_2$, $R_3$, and $R_4$ may be estimated.

Choppers 134 may each include any suitable system, device, or apparatus configured to perform signal chopping in order to minimize thermocouple-related sensor effects.

External resistor 108 may be any suitable system, device, or apparatus configured to provide a fixed resistance. Although referred to as "external" and shown as external to integrated circuit 106 in FIG. 1, in some embodiments, external resistor 108 may be formed internally within integrated circuit 106.

The arrangement of system 100 depicted in FIG. 1 may enable accurate measurement of resistances $R_1$, $R_2$, $R_3$, and $R_4$ independent of various switch resistances of system 100. For example, by appropriately coupling a ground of the voltage divider of reference resistors 112a and 112b and an ADC reference voltage, effects of resistance $R_{sw\_gnd}$ of ground switch 118 may be minimized Resistance $R_{sw\_ext}$ of resistance switches 122a and 122b may be measured using the systems and methods described herein such that its impact may be eliminated through calculation. The ADC reference voltage received by ADC 130 does not consume significant current, and thus resistance $R_{sw\_adc}$ of ADC switch 120 may be of little concern. In addition, resistance $R_{sw\_ref}$ of reference switch 116 may be of little concern if such resistance is small compared to resistances $R_1$, $R_2$, $R_3$, and $R_4$. Resistances $R_{sm\_in1}$ and $R_{sm\_in2}$ of primary input switches 124a and 124b and secondary input switches 126a-f are within sensing paths, and thus carry little or no current. Accordingly, these various switch impedances contribute little or no error in the estimation of resistances $R_1$, $R_2$, $R_3$, and $R_4$.

Figure 2:
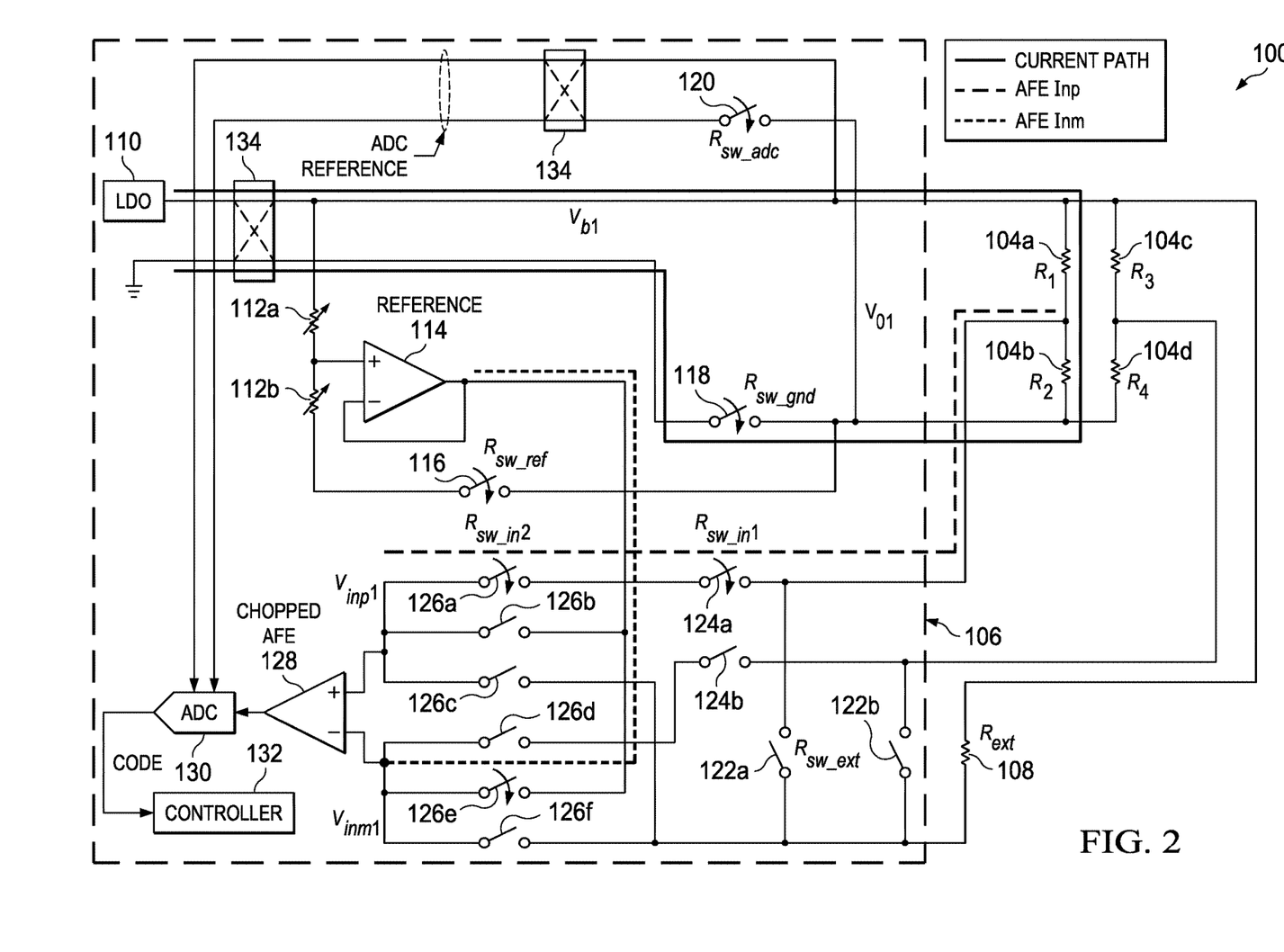
FIG. 2 illustrates the system of FIG. 1 in a first step for estimating resistances of the Wheatstone bridge circuit, in accordance with embodiments of the present disclosure.

FIG. 2 illustrates system 100 of FIG. 1 in a first step for estimating resistances $R_1$ and $R_2$ of Wheatstone bridge circuit 102, in accordance with embodiments of the present disclosure. As shown in FIG. 2, controller 132 may cause closure of reference switch 116, ground switch 118, ADC switch 120, primary input switch 124a, secondary input switch 126a, and secondary input switch 126e. Thus, a bias voltage may be applied across Wheatstone bridge circuit 102 and current may flow from LDO 110, through resistors 104a and 104b, to ground. Further, AFE positive input voltage $V_{imp1}$ may be equal to the voltage at the electrical node interfaced between resistors 104a and 104b while AFE negative input voltage $V_{inm1}$ may be equal to the output of reference amplifier 114. Accordingly, the analog output of chopped AFE 128 may be given by:

$$V_{inp_1} - V_{inm_1} =$$
$$V_{diff_1} = \left[(V_{b_1} - V_{0_1}) \times \frac{R_2}{R_1 + R_2} + V_{0_1}\right] - \left[(V_{b_1} - V_{0_1}) \times \alpha + V_{0_1}\right]$$

where $V_{b1}$ equals a voltage at a first terminal of Wheatstone bridge circuit 102, $V_{01}$ equals a voltage at a second terminal of Wheatstone bridge circuit 102, and $\alpha$ represents a reference factor related to the voltage divider of reference resistors 112a and 112b (wherein variable reference resistances of reference resistors 112a and 112b may be controlled by controller 132). As a result, during this first step, ADC 130 may generate digital signal CODE having a value of $Code_1$, given by:

$$Code_1 = \frac{V_{diff_1} \times G_{afe}}{V_{b_1} - V_{0_1}}$$

where $G_{afe}$ represents a path gain of chopped AFE 128 and ADC 130.

Figure 3:
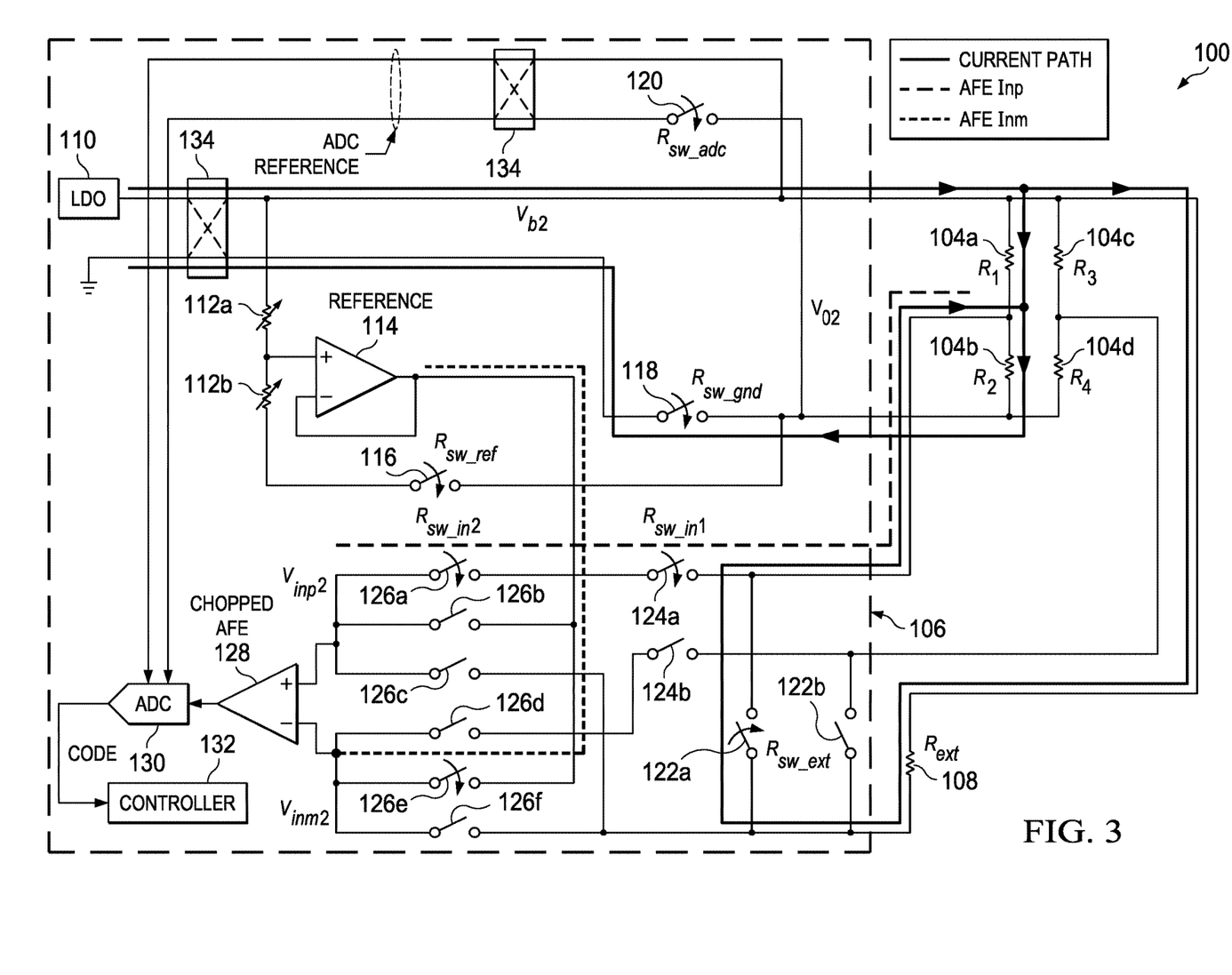
FIG. 3 illustrates the system of FIG. 1 in a second step for estimating resistances of the Wheatstone bridge circuit, in accordance with embodiments of the present disclosure.

FIG. 3 illustrates the system 100 of FIG. 1 in a second step for estimating resistances $R_1$ and $R_2$ of Wheatstone bridge circuit 102, in accordance with embodiments of the present disclosure. As shown in FIG. 3, controller 132 may cause closure of reference switch 116, ground switch 118, ADC switch 120, primary input switch 124$a$, secondary input switch 126$a$, secondary input switch 126$e$, and resistance switch 122$a$. Thus, a bias voltage may be applied across Wheatstone bridge circuit 102 and external resistor 108, and current may flow from LDO 110, through the parallel combination of external resistor 108 and with the serial combination of resistors 104$a$ and 104$b$, to ground. Further, AFE positive input voltage $V_{inp2}$ may be equal to the voltage at the electrical node interfaced between resistors 104$a$ and 104$b$ while AFE negative input voltage $V_{inm2}$ may be equal to the output of reference amplifier 114. Accordingly, the analog output of chopped AFE 128 may be given by:

$$V_{inp_2} - V_{inm_2} = V_{diff_2} =$$
$$\left[(V_{b_2} - V_{0_2}) \times \frac{R_2}{R_1 \| (R_{ext} + R_{sw\_ext}) + R_2} + V_{0_2}\right] - \left[(V_{b_2} - V_{0_2}) \times \beta + V_{0_2}\right]$$

where $V_{b2}$ equals a voltage at the first terminal of Wheatstone bridge circuit 102, $V_{O2}$ equals a voltage at the second terminal of Wheatstone bridge circuit 102, and $\beta$ represents a reference factor related to the voltage divider of reference resistors 112$a$ and 112$b$ (wherein variable reference resistances of reference resistors 112$a$ and 112$b$ may be controlled by controller 132). As a result, during this second step, ADC 130 may generate digital signal CODE having a value of $Code_2$, given by:

$$Code_2 = \frac{V_{diff_2} \times G_{afe}}{V_{b_2} - V_{0_2}}$$

where again $G_{afe}$ represents a path gain of chopped AFE 128 and ADC 130.

Figure 4:
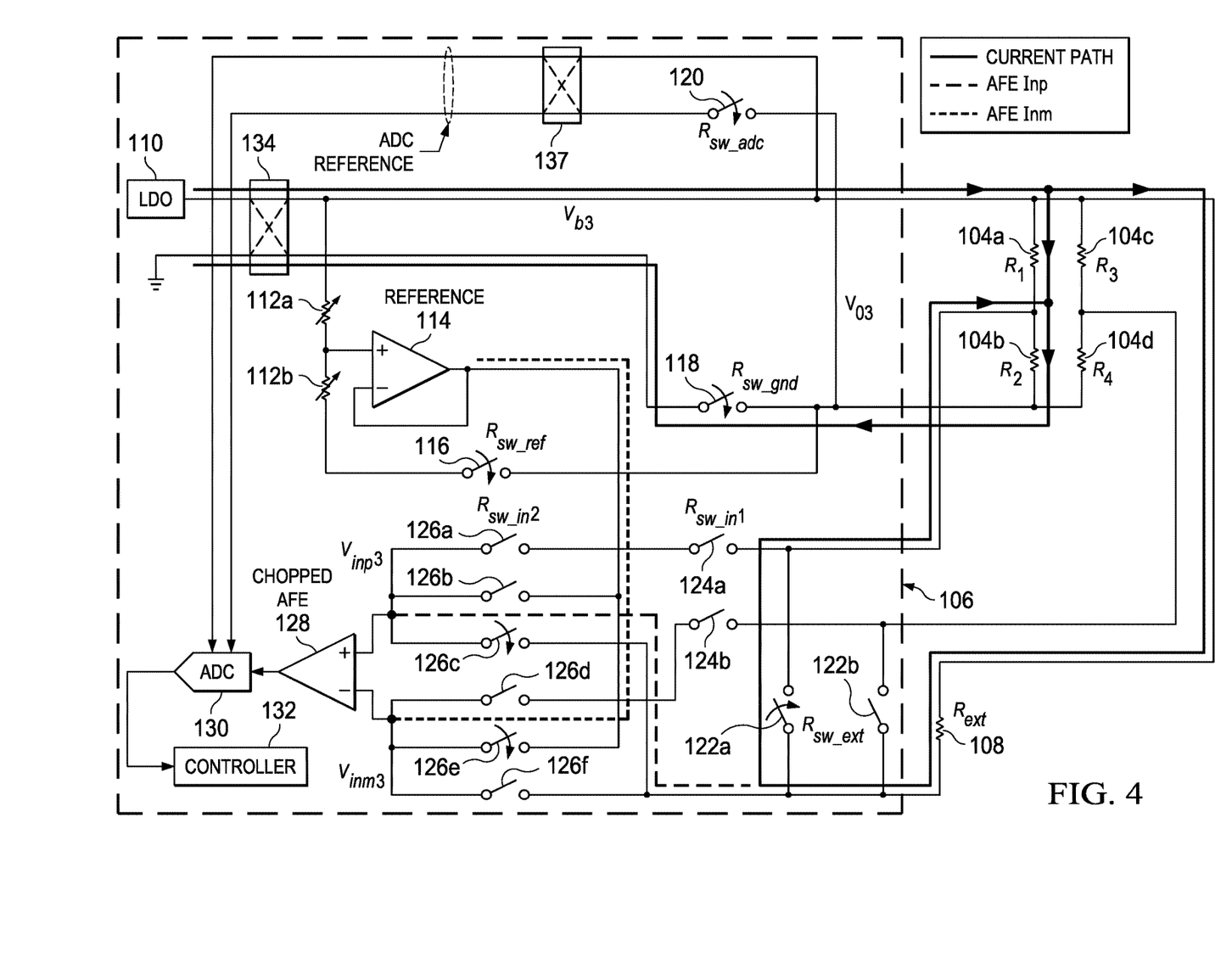
FIG. 4 illustrates the system of FIG. 1 in a third step for estimating resistances of the Wheatstone bridge circuit, in accordance with embodiments of the present disclosure.

FIG. 4 illustrates system 100 of FIG. 1 in a third step for estimating resistances $R_1$ and $R_2$ of Wheatstone bridge circuit 102, in accordance with embodiments of the present disclosure. As shown in FIG. 4, controller 132 may cause closure of reference switch 116, ground switch 118, ADC switch 120, secondary input switch 126$c$, secondary input switch 126$e$, and resistance switch 122$a$. Notably, primary input switch 124$a$ and secondary input switch 126$a$, which were closed during the first and second steps, are open in this third step. Thus, current may flow from LDO 110, through the parallel combination of external resistor 108 and with the serial combination of resistors 104$a$ and 104$b$, to ground. Further, AFE positive input voltage $V_{inp3}$ may be equal to the voltage at a terminal of external resistor 108 opposite the terminal of external resistor 108 to which voltage $V_{b3}$ is applied, while AFE negative input voltage $V_{inm3}$ may be equal to the output of reference amplifier 114. Accordingly, the analog output of chopped AFE 128 may be given by:

$$V_{inp_3} - V_{inm_3} = V_{diff_3} = \left[(V_{b_3} - V_{0_3}) \times \right.$$

-continued
$$\left. \frac{R_2 R_{sw\_ext} + \{R_1 \| (R_{ext} + R_{sw\_ext})\} R_{sw\_ext} + R_2 R_{ext}}{[R_2 + \{R_1 \| (R_{ext} + R_{sw\_ext})\}] \times [R_{sw\_ext} + R_{ext}]} + V_{0_3}\right] -$$
$$\left[(V_{b_3} - V_{0_3}) \times \gamma + V_{0_3}\right]$$

where $V_{b3}$ equals a voltage at the first terminal of Wheatstone bridge circuit 102, $V_{O3}$ equals a voltage at the second terminal of Wheatstone bridge circuit 102, and $\gamma$ represents a reference factor related to the voltage divider of reference resistors 112$a$ and 112$b$ (wherein variable reference resistances of reference resistors 112$a$ and 112$b$ may be controlled by controller 132). As a result, during this second step, ADC 130 may generate digital signal CODE having a value of $Code_3$, given by:

$$Code_3 = \frac{V_{diff_3} \times G_{afe}}{V_{b_3} - V_{0_3}}$$

where yet again $G_{afe}$ represents a path gain of chopped AFE 128 and ADC 130.

Assuming an application in which external resistance $R_{ext}$ is known or an application in which it is acceptable to determine resistances $R_1$ and $R_2$ by their respective ratios to external resistance $R_{ext}$, the equations for $Code_1$, $Code_2$, and $Code_3$ provide a system of three equations with three unknown variables, resistance $R_1$, resistance $R_2$, and external switch resistance $R_{sw\_ext}$. Using known algebraic principles, controller 132 may calculate resistances $R_1$ and $R_2$ as follows:

$$R_1 = \frac{Code_1 G_{afe} R_{ext} - Code_2 G_{afe} R_{ext} + \alpha G_{afe}^2 R_{ext} - \beta G_{afe}^2 R_{ext}}{[Code_1 + \alpha G_{afe}] \times [Code_3 - G_{afe} + G_{afe} \gamma]}$$

$$R_2 = \frac{Code_2 G_{afe} R_{ext} + \beta G_{afe}^2 R_{ext} - Code_1 G_{afe} R_{ext} - \alpha G_{afe}^2 R_{ext}}{Code_1 Code_3 - Code_1 Code_{afe} - Code_3 G_{afe} - \alpha G_{afe}^2 -}$$
$$G_{afe}^2 \gamma + G_{afe}^2 + \alpha Code_3 G_{afe} + Code_1 G_{afe} \gamma + \alpha G_{afe}^2 \gamma$$

Using the approaches described above, similar steps and calculation may be used by controller 132 to estimate resistances $R_3$ and $R_4$. In particular, the three steps described above may be performed to estimate resistances $R_3$ and $R_4$, except that:

(a) references to resistance switch 122$a$ are replaced with resistance switch 122$b$;

(b) references to primary input switch 124$a$ are replaced with primary input switch 124$b$;

(c) references to secondary input switch 126$a$ are replaced with secondary input switch 126$d$;

(d) references to secondary input switch 126$c$ are replaced with secondary input switch 126$f$; and (e) references to secondary input switch 126$e$ are replaced with secondary input switch 126$b$.

One disadvantage of the above approach is that it may require gain calibration of path gain $G_{afe}$. Accordingly, approaches in which gain calibration is not needed may be desired.

Figure 5:
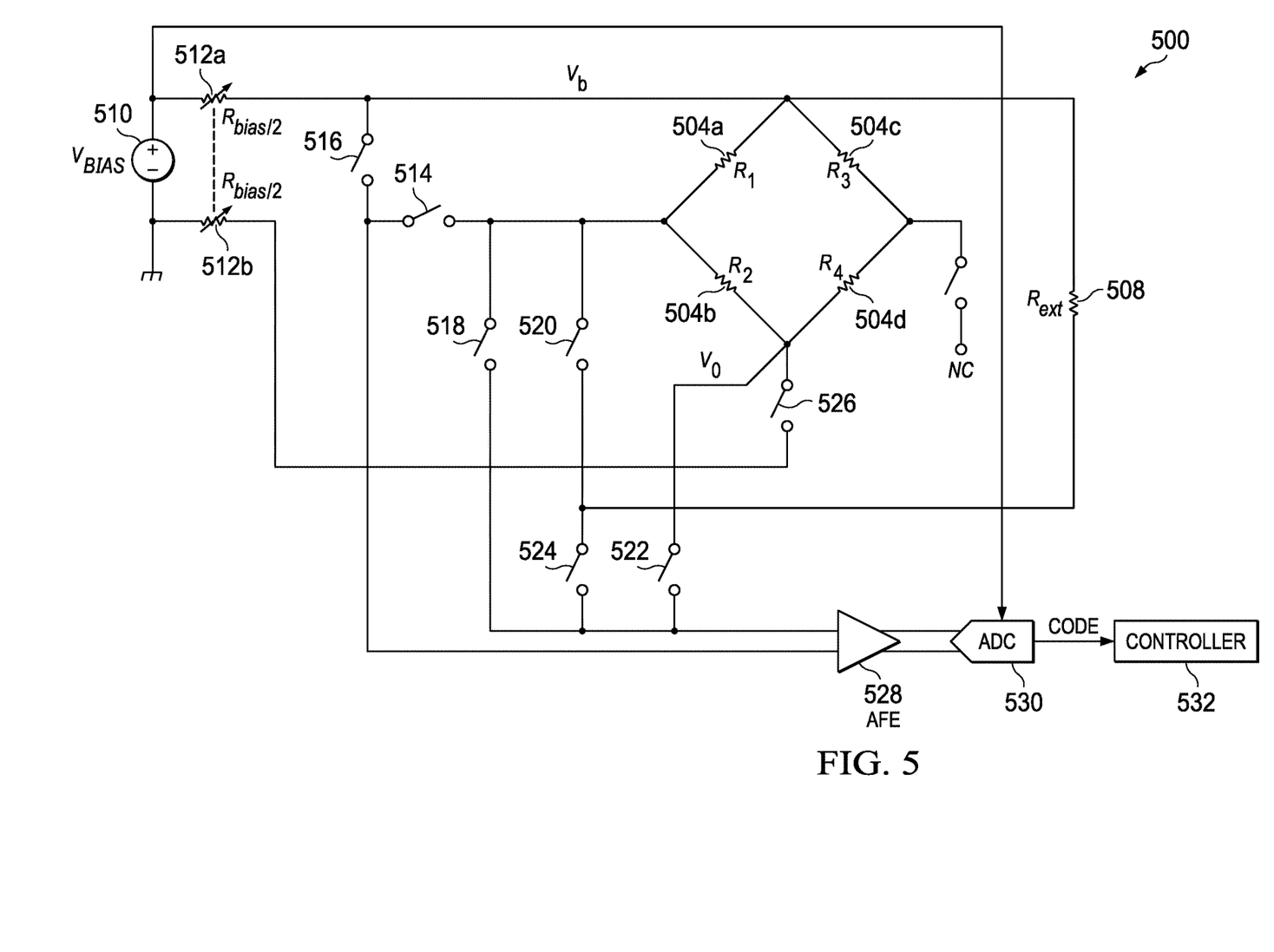
FIG. 5 illustrates a block and circuit diagram of another example system for estimating resistances of a Wheatstone bridge circuit, in accordance with embodiments of the present disclosure.

FIG. 5 illustrates a block and circuit diagram of an example system 500 for estimating resistances (e.g., resistances $R_1$, $R_2$, $R_3$, and $R_4$, respectively, of resistors 504$a$, 504$b$, 504$c$, and 504$d$) of a Wheatstone bridge circuit, in accordance with embodiments of the present disclosure. As shown in FIG. 5, system 500 may include external resistor 508, voltage source 510, variable bias resistors 512a and 512b, switches 514, 516, 518, 520, 522, 524, and 526, chopped analog front end (AFE) 528, ADC 530, and controller 532, and choppers 134 arranged as shown in FIG. 1.

External resistor 508 may be any suitable system, device, or apparatus configured to provide a fixed resistance. In some embodiments, external resistor 508 may be, along with the Wheatstone bridge circuit comprising resistors 504a, 504b, 504c, and 504d, external to an integrated circuit that includes other components of system 500. However, in other embodiments, external resistor 508 may be formed internally within such integrated circuit.

Voltage source 510 may comprise any suitable system, device, or apparatus configured to generate a regulated bias voltage $V_{bias}$ for use by components of system 500. In some embodiments, voltage source 510 may comprise an LDO.

Each variable bias resistor 512a and 512b may comprise a variable resistor having a variable resistance controlled by controller 532 (connectivity of control signals for providing such control are not shown, for purposes of clarity of exposition). In operation, as set forth in greater detail below, variable reference resistors 512a and 512b may modulate a voltage $V_b - V_0$ applied across the Wheatstone bridge, as described in greater detail below.

Each switch 514, 516, 518, 520, 522, and 524 may include a transistor (e.g., n-type field effect transistor) or any other suitable system, device, or apparatus for implementing a switch that may selectively be toggled opened (e.g., off, disabled, deactivated) and closed (e.g., on, enabled, activated). The closing and opening of such switches may be controlled by controller 532 (connectivity of control signals for providing such control are not shown, for purposes of clarity of exposition).

Chopped AFE 528 may comprise any suitable system, device, or apparatus to condition a differential input signal received at its input for use by ADC 530. Accordingly, chopped AFE 528 may include analog signal conditioning circuitry comprising analog amplifiers, filters, application-specific integrated circuits for sensors, and/or other circuits to provide a configurable and flexible electronics functional block to interface between the Wheatstone bridge, external resistor 508, and bias circuitry of system 500 on one hand and ADC 530 on the other hand.

ADC 530 may comprise any suitable system, device, or apparatus configured to convert an analog signal generated by chopped AFE 528 into an equivalent digital signal CODE.

Controller 532 may include any suitable system, device, or apparatus configured to receive values of digital signal CODE from ADC 530 and, as described in greater detail below, estimate resistances $R_1$, $R_2$, $R_3$, and $R_4$. In addition, controller 532 may, as described in greater detail below, control operation of variable bias resistors 512a and 512b and the various switches of system 500 in order to generate values of digital signal CODE from which resistances $R_1$, $R_2$, $R_3$, and $R_4$ may be estimated.

Similar to that of system 100 described above, system 500 may execute a number of steps in order to estimate resistances $R_1$, $R_2$, $R_3$, and $R_4$.

In a first step, controller 532 may close switches 516, 522, and 526, leaving remaining switches 514, 518, 520, and 524 open. Further, controller 532 may set a bias resistance $R_{bias}$ to its maximum value. During this first step, controller 532 may reduce bias resistance $R_{bias}$ to where approximately one-half to three-fourths of the full scale signal is registered as the digital signal CODE output by ADC 530. Such value of bias resistance $R_{bias}$ may be maintained by controller 532 through the remaining steps described below. Further, controller 532 may record this output value of ADC 530 as $Code_1$, wherein $Code_1 = (V_b - V_0)G_{afe}$, where $G_{afe}$ represents a path gain of chopped AFE 128 and ADC 130.

In a second step, controller 532 may close switches 516, 518, and 526, leaving remaining switches 514, 520, 522, and 524 open, and record the digital signal CODE output by ADC 530 as $Code_2$. $Code_1$ and $Code_2$ may be related as follows:

$$\frac{Code_2}{Code_1} = \frac{R_1}{R_1 + R_2}$$

In a third step, controller 532 may close switches 516, 520, 522, and 526, leaving remaining switches 514, 518, and 524 open, and record the digital signal CODE output by ADC 530 as $Code_3$. The measurement of $Code_3$ may be indicative of a bridge voltage $(V_b - V_0)$ due to additional current injected because of the external resistance $R_{ext}$ and with non-zero $R_{bias}$.

In a fourth step, controller 532 may close switches 516, 518, 520, and 526, leaving remaining switches 514, 522, and 524 open, and record the digital signal CODE output by ADC 530 as $Code_4$. The measurement of $Code_4$ may be indicative of a voltage across resistance $R_1$ in parallel with the series combination of the external resistance $R_{ext}$ and a resistance of switch 520.

In a fifth step, controller 532 may close switches 516, 520, 524, and 526, leaving remaining switches 514, 518, and 522 open, and record the digital signal CODE output by ADC 530 as $Code_5$. The measurement of $Code_5$ may be indicative of a voltage across external resistance $R_{ext}$ when switch 520 is closed, which may be indicative of a current injected into the half bridge of resistors 504a and 504b.

From these five steps above, controller 532 may estimate resistances $R_1$ and $R_2$ as follows:

$$R_2 = \left( \frac{Code_3 Code_2 - Code_1 Code_4}{Code_5 Code_2} \right) R_{ext}$$

$$R_1 = \frac{Code_2 R_2}{Code_1 - Code_2}$$

Notably, such calculations are independent of AFE and ADC gain of system 500. Similar steps and calculations may be performed for resistances $R_3$ and $R_4$ using a similar switch matrix coupled to the electrical node interface between resistor 504c and resistor 504d.

In some embodiments, a sixth step may be employed to estimate an offset of chopped AFE 528. For example, controller 532 may close switch 514, 518, and 526 while opening switches 516, 520, 524 and 522 after the first step. This sixth step may effectively allow the offset of AFE 528 to be measured by the ADC 530, with the digital signal CODE output by ADC 530 recorded as $Code_0$. $Code_0$ may be subtracted from the other codes, resulting in a calculation of resistances $R_1$ and $R_2$ as follows:

$$R_2 = \left( \frac{(Code_3 - Code_0)(Code_2 - Code_0) - (Code_1 - Code_0)(Code_4 - Code_0)}{(Code_5 - Code_0)(Code_2 - Code_0)} \right) R_{ext}$$

$$R_1 = \frac{(Code_2 - Code_0)R_2}{Code_1 - Code_2}$$

In any case, the precision of external resistance $R_{ext}$ may be transferred to bridge resistances $R_1$ and $R_2$ via ratiometric calculations that are independent of a gain of the AFE 528 and/or ADC 530.

Although the foregoing contemplates estimation of individual resistance values of a Wheatstone bridge circuit, it is understood that similar or identical approaches may be used to calculate individual resistance values of other resistive sensors, such as, for example, individual resistances of a voltage divider.

The resistances determined using the systems and methods described above may have any suitable use. For example, in some embodiments, the determined resistances may be compared against predefined resistance values in order to detect a device that may have been tampered with, as significant changes in resistance may indicate presence of an after-market sensor in lieu of a sensor provided during original manufacture of a device. Accordingly, if changes in resistance values indicate tampering, an alert or other responsive action may be generated. As another example, in these and other embodiments, the determined resistances may be used in a sensor calibration operation or similar operation.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for estimating resistances of a circuit having a plurality of resistances comprising a first resistance and a second resistance, comprising:
    applying a first bias voltage across the circuit and measuring a first voltage at a common node between the first resistance and the second resistance in order to determine a mathematical relationship between the first resistance and the second resistance;
    applying a second bias voltage across the circuit and a third resistance in parallel with the circuit and measuring a second voltage at the common node between the first resistance and the second resistance in order to determine a mathematical relationship between the third resistance and at least one of the first resistance and the second resistance; and
    based on at least the measurement of the first voltage and the measurement of the second voltage, determining the first resistance and the second resistance as a function of the third resistance.

2. The method of claim 1, further comprising applying a third bias voltage across the circuit and the third resistance and measuring a third voltage of a terminal of a switch configured to couple the third resistance to a measuring node for measuring the first voltage, the second voltage, and the third voltage in order to determine a resistance associated with the switch.

3. The method of claim 1, further comprising applying a third bias voltage across the circuit and the third resistance and measuring a third voltage of a terminal of a switch configured to couple the common node to a measuring node for measuring the first voltage, the second voltage, and the third voltage in order to determine a resistance associated with the common node.

4. The method of claim 1, wherein the third resistance is known.

5. The method of claim 1, wherein the third resistance is internal to an integrated circuit having a controller for generating the first bias voltage and the second bias voltage and measuring the first voltage and the second voltage.

6. The method of claim 1, wherein the third resistance is external to an integrated circuit having a controller for generating the first bias voltage and the second bias voltage and measuring the first voltage and the second voltage.

7. The method of claim 1, wherein the circuit is a Wheatstone bridge circuit.

8. The method of claim 1, wherein the first bias voltage and the second bias voltage are equal.

9. The method of claim 1, further comprising:
applying a third bias voltage across the circuit and measuring a third voltage across the circuit in order to determine a path gain of measurement circuitry;
applying a fourth bias voltage across the circuit and the third resistance and measuring a fourth voltage across the circuit in order to determine a voltage across the circuit with current injected from the third resistance; and
based on at least the measurement of the first voltage, the measurement of the second voltage, the measurement of the third voltage, and the measurement of the fourth voltage, determining the first resistance and the second resistance as a function of the third resistance.

10. The method of claim 9, wherein the first bias voltage, the second bias voltage, the third bias voltage, and the fourth bias voltage are equal.

11. The method of claim 9, further comprising:
applying a fifth bias voltage across the circuit and the third resistance and measuring a fifth voltage across the circuit in order to determine an amount of current injected into the circuit by the third resistance; and
based on at least the measurement of the first voltage, the measurement of the second voltage, the measurement of the third voltage, the measurement of the fourth voltage, and the measurement of the fifth voltage, determining the first resistance and the second resistance as a function of the third resistance.

12. The method of claim 11, wherein the first bias voltage, the second bias voltage, the third bias voltage, the fourth bias voltage, and the fifth bias voltage are equal.

13. The method of claim 11, further comprising:
applying a sixth bias voltage across the circuit and the third resistance and measuring a sixth voltage across the circuit in order to determine an amount of offset in measurement circuitry; and
based on at least the measurement of the first voltage, the measurement of the second voltage, the measurement of the third voltage, the measurement of the fourth voltage, the measurement of the fifth voltage, and the sixth voltage, determining the first resistance and the second resistance as a function of the third resistance.

14. The method of claim 13, wherein the first bias voltage, the second bias voltage, the third bias voltage, the fourth bias voltage, the fifth bias voltage, and the sixth bias voltage are equal.

15. A system for estimating resistances of a circuit having a plurality of resistances comprising a first resistance and a second resistance, the system comprising:
a controller configured to:
apply a first bias voltage across the circuit and measuring a first voltage at a common node between the first resistance and the second resistance in order to determine a mathematical relationship between the first resistance and the second resistance;
apply a second bias voltage across the circuit and a third resistance in parallel with the circuit and measuring a second voltage at the common node between the first resistance and the second resistance in order to determine a mathematical relationship between the third resistance and at least one of the first resistance and the second resistance; and
based on at least the measurement of the first voltage and the measurement of the second voltage, determine the first resistance and the second resistance as a function of the third resistance.

16. The system of claim 15, the controller further configured to apply a third bias voltage across the circuit and the third resistance and measuring a third voltage of a terminal of a switch configured to couple the third resistance to a measuring node for measuring the first voltage, the second voltage, and the third voltage in order to determine a resistance associated with the switch.

17. The system of claim 15, the controller further configured to apply a third bias voltage across the circuit and the third resistance and measuring a third voltage of a terminal of a switch configured to couple the common node to a measuring node for measuring the first voltage, the second voltage, and the third voltage in order to determine a resistance associated with the common node.

18. The system of claim 15, wherein the third resistance is known.

19. The system of claim 15, wherein the third resistance is internal to an integrated circuit having a controller for generating the first bias voltage and the second bias voltage and measuring the first voltage and the second voltage.

20. The system of claim 15, wherein the third resistance is external to an integrated circuit having a controller for generating the first bias voltage and the second bias voltage and measuring the first voltage and the second voltage.

21. The system of claim 15, wherein the circuit is a Wheatstone bridge circuit.

22. The system of claim 15, wherein the first bias voltage and the second bias voltage are equal.

23. The system of claim 15, the controller further configured to:
apply a third bias voltage across the circuit and measuring a third voltage across the circuit in order to determine a path gain of measurement circuitry;
apply a fourth bias voltage across the circuit and the third resistance and measuring a fourth voltage across the circuit in order to determine a voltage across the circuit with current injected from the third resistance; and
based on at least the measurement of the first voltage, the measurement of the second voltage, the measurement of the third voltage, and the measurement of the fourth voltage, determine the first resistance and the second resistance as a function of the third resistance.

24. The system of claim 23, wherein the first bias voltage, the second bias voltage, the third bias voltage, and the fourth bias voltage are equal.

25. The system of claim 23, the controller further configured to:
apply a fifth bias voltage across the circuit and the third resistance and measuring a fifth voltage across the circuit in order to determine an amount of current injected into the circuit by the third resistance; and
based on at least the measurement of the first voltage, the measurement of the second voltage, the measurement of the third voltage, the measurement of the fourth voltage, and the measurement of the fifth voltage, determine the first resistance and the second resistance as a function of the third resistance.

26. The system of claim 25, wherein the first bias voltage, the second bias voltage, the third bias voltage, the fourth bias voltage, and the fifth bias voltage are equal.

27. The system of claim 25, the controller further configured to:
- apply a sixth bias voltage across the circuit and the third resistance and measuring a sixth voltage across the circuit in order to determine an amount of offset in measurement circuitry; and
- based on at least the measurement of the first voltage, the measurement of the second voltage, the measurement of the third voltage, the measurement of the fourth voltage, the measurement of the fifth voltage, and the sixth voltage, determine the first resistance and the second resistance as a function of the third resistance.

28. The system of claim 27, wherein the first bias voltage, the second bias voltage, the third bias voltage, the fourth bias voltage, the fifth bias voltage, and the sixth bias voltage are equal.

\* \* \* \* \*